United States Patent [19]

Chien et al.

[11] Patent Number: 4,973,525
[45] Date of Patent: Nov. 27, 1990

[54] METAL-INSULATOR COMPOSITES HAVING IMPROVED PROPERTIES AND METHOD FOR THEIR PREPARATION

[75] Inventors: Chia-Ling Chien, Lutherville; Gang Xiao, Baltimore, both of Md.; Sy-Hwang Liou, Lincoln, Nebr.

[73] Assignee: The Johns Hopkins University, Baltimore, Md.

[21] Appl. No.: 257,908

[22] Filed: Oct. 14, 1988

[51] Int. Cl.⁵ .......................... B32B 9/00; C23C 14/34
[52] U.S. Cl. ............................. 428/692; 204/192.15; 204/192.2; 204/192.23; 428/693
[58] Field of Search ............ 204/192.15, 192.2, 192.22, 204/192.23; 428/692, 693, 900

[56] References Cited

U.S. PATENT DOCUMENTS 3,644,188  2/1972  Sharp et al. ................... 204/298 X
3,843,420 10/1974  Gittleman et al. ........... 252/62.59 X

OTHER PUBLICATIONS

Chien et al., "Granular Fe Metal Films", J. of Mag. and Mag. Materials, 54–57 (1986).
Liou et al., "Granular . . . Media", Appl. Phys. Lett., 52(6), Feb. 8, 1988.
Xiao et al., "Giant . . . Solids", Appl. Phys. Lett. 51(6), Oct. 19, 1987.
Liou et al., "Particle Size . . . Films", J. Appl. Phys., 63(8), Apr. 15, 1988.

*Primary Examiner*—Nam X. Nguyen
*Attorney, Agent, or Firm*—Cushman, Darby & Cushman

[57] ABSTRACT

Improved cermets having superior properties comprising a ferromagnetic metal and an insulator. By controlling process conditions, cermets having high magnetization and high coercivity as well as chemical stability, wear resistance and corrosion resistance are prepared. The cermets of this invention find particular utility as high density recording media.

20 Claims, 3 Drawing Sheets (SUBSTRATE TEMPERATURE)

FIG. 2a
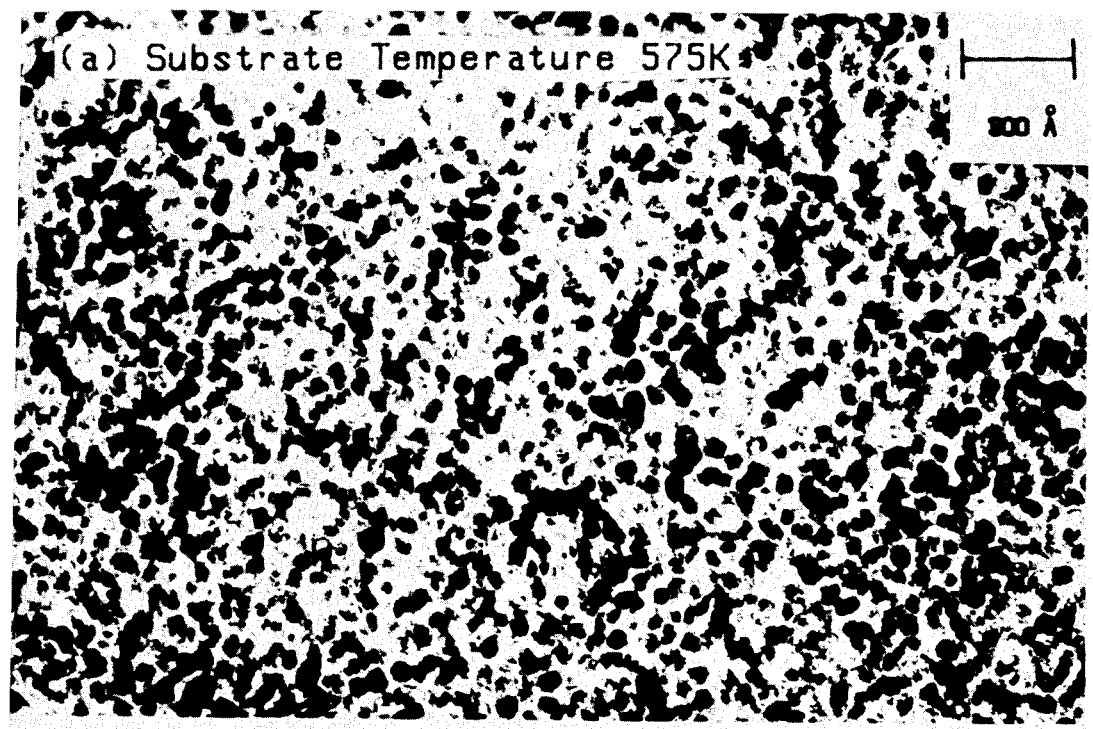
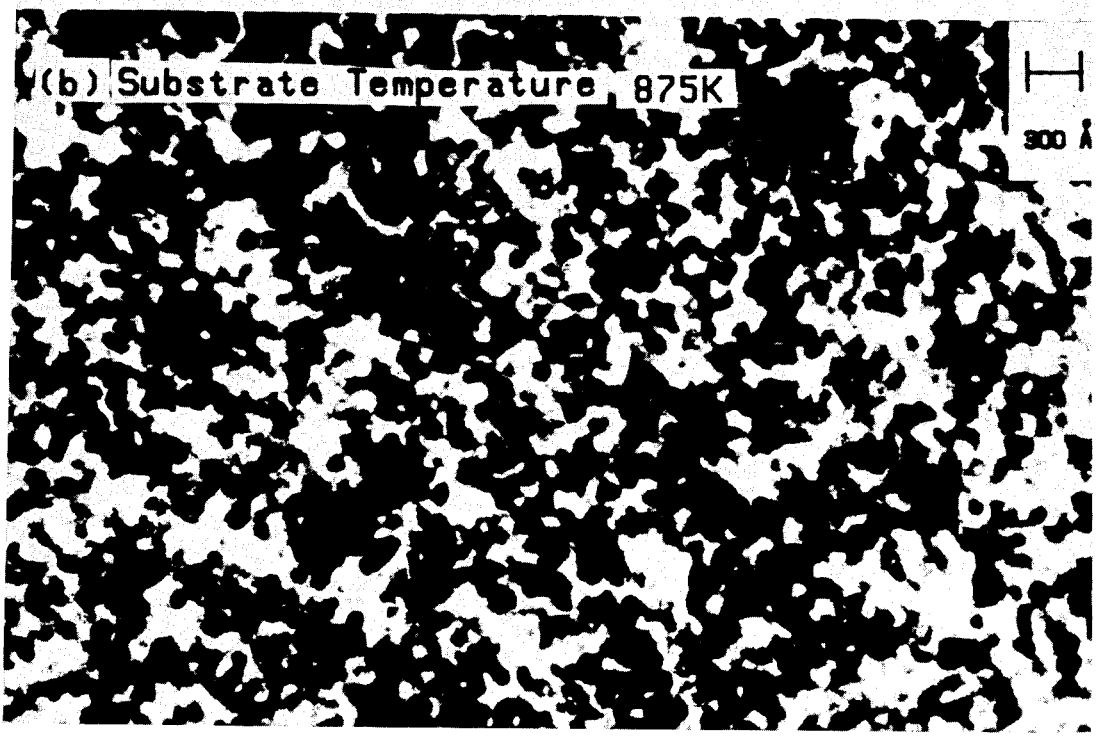
FIG. 2b

METAL-INSULATOR COMPOSITES HAVING IMPROVED PROPERTIES AND METHOD FOR THEIR PREPARATION

This invention was made with Government support under Contract N0014-85-K-0175 awarded by the Department of the Navy. The Government has certain rights in the invention.

The invention described and claimed herein was made under a contract from the Office of Naval Research.

This invention is broadly concerned with metalinsulator composites having improved properties, and their method of preparation. More particularly, it is concerned with ferromagnetic metal-ceramic composites, i.e., cermets, having properties that make them particularly useful as high density recording media. By carefully controlling process conditions, cermets having high magnetization and high coercivity as well as chemical stability, wear resistance and corrosion resistance are prepared.

BACKGROUND OF THE INVENTION

The demand for high density recording media with superior magnetic properties is constantly increasing. Such recording media must also be chemically stable and wear resistant. Magnetic granular solids in which ultrafine magnetic particles are imbedded in an insulating matrix offer attractive features as recording media. The insulating matrix greatly enhances the chemical stability of the ultrafine magnetic particles as well as the wear and corrosion resistance of the media. In addition, since vapor deposition is the most effective method of making granular metal films, the fabrication, dispersion and protection of the ultrafine granules, as well as coating onto desired surfaces suitable for device applications, are achieved in a single process.

In granular metal films, the microstructure is crucial to the magnetic properties. The magnetic properties of the granular solids are microstructure-controlled and can be tailored through careful control of the process conditions for their preparation. The size and shape of the metal granules, their connectivity and associated percolation behavior, and their volume fraction in the composite are of primary importance. We show in our paper in *Appl. Phys. Lett.*, 51, 1280 (1987) that in granular Fe-SiO2, when the metal volume fraction (p) is near but below the percolation threshold ($p_c$), greatly enhanced magnetic properties are realized. The coercivity ($H_c$) at low temperature was found to be as high as two orders of magnitude greater than that of bulk iron. However, the metal granules were relatively small, i.e., smaller than about 70 Å. Consequently, coercivity at room temperature was greatly reduced, primarily due to superparamagnetic relaxation. The paper by Chien et al. in *J. of Magnetism and Magnetic Materials*, 54–57, 759-760 (1986) is a preliminary study which describes Fe-SiO$_2$ composites having an iron volume fraction of 0.52 and estimated average iron granule sizes of about 90 Å and about 160 Å. However, these composites are deficient as high density recording media in that their levels of magnetization and coercivity at room temperature are not sufficiently high. This is a result of the method by which they were prepared.

SUMMARY OF THE INVENTION

Broadly, this invention is concerned with a process for preparing improved ferromagnetic metal-insulator composites, i.e., cermets, and the cermets produced by said process. More particularly, the invention is concerned with cermets and a process for their preparation wherein said cermets have superior properties such as high magnetization and surprisingly high coercivity as well as chemical stability, wear resistance and corrosion resistance. Such cermets find particular utility as high density recording media. It has been found that there is a relationship between the magnetic properties of the cermets and their microstructure. By carefully controlling process conditions, the microstructure, and hence the magnetic properties, of the cermets can be controlled. The cermets of this invention are made by a sputtering process using a radio frequency (rf) source, a simple direct current (dc) source or a magnetron. The process variables that have the most pronounced effect on the magnetic properties of the cermet are the inert sputtering gas pressure, deposition rate and substrate temperature. The metal volume fraction and the metal particle size in the resultant cermet are also critical factors.

It is therefore an object of this invention to provide metal-insulator composites having improved properties as well as a novel process for their preparation.

It is another object of this invention to provide ferromagnetic metal-ceramic composites having improved magnetic properties as well as a novel process for their preparation.

It is yet another object of this invention to provide ferromagnetic metal-ceramic composites having high magnetization and high coercivity as well as chemical stability, wear resistance and corrosion resistance.

It is still another object of this invention to provide a process for the preparation of ferromagnetic metal-ceramic composites having high magnetization and high coercivity as well as chemical stability, wear resistance and corrosion resistance.

Yet other objects will be apparent to those skilled in the art. The foregoing and other objects are accomplished by the practice of this invention. Broadly, viewed in one of its principal aspects, this invention consists of a process for preparing ferromagnetic metal-insulator composites having a metal volume fraction within the range of from about 0.30 to about 0.55 and a metal particle size within the range of from about 30 Å to about 200 Å comprising the steps:

1. Preparing a composite target comprising a mixture of a pure ferromagnetic metal and an insulator;
2. Placing said composite target in a sputtering apparatus containing a substrate;
3. Maintaining the substrate at a temperature within the range of from about 300° K. to about 900° K., and
4. Subjecting said composite target to ionic bombardment to thereby sputter a homogeneous film of said ferromagnetic metal and said insulator onto the surface of said substrate.

The cermets of this invention are ferromagnetic metal-insulator composites having a metal volume fraction with the range of from about 0.30 to about 0.55 and a metal particle size within the range of from about 30 Å to about 200 Å prepared by a process comprising the steps:

1. Preparing a composite target comprising a mixture of a pure ferromagnetic metal and an insulator;

2. Placing said composite target in a sputtering apparatus containing a substrate;

3. Maintaining the substrate at a temperature within the range of from about 300° K. to about 900° K., and 4. Subjecting said composite target to ionic bombardment to thereby sputter a homogeneous film of said ferromagnetic metal and said insulator onto the surface of said substrate.

The instant invention thus provides metal-insulator composites, i.e., cermets, having improved properties, and their method of preparation. More particularly, this invention provides ferromagnetic metal-ceramic composites having properties that make them particularly useful a high density recording media. It has been found that there is a relationship between the magnetic properties of the cermets and their microstructure. By carefully controlling the process conditions for their preparation, the microstructure, and hence the magnetic properties, of the cermets can be controlled. The cermets of this invention are made by a sputtering process using a radio frequency (rf) source, a simple direct current (dc) source or a magnetron. The process variables that have the most pronounced effect on the magnetic properties of the cermets are the inert sputtering gas pressure, deposition rate, and substrate temperature. Other critical parameters are the metal particle size and the metal volume fraction in the resultant cermet.

The nature and substance of the present invention as well as it objects and advantages will be more clearly perceived and fully understood by referring to the following description and claims taken in connection with the accompanying drawings which are described briefly below.

BRIEF DESCRIPTION OF THE DRAWINGS

FIG. 2 (a) is a micrograph of an Fe-$SiO_2$ composite having an Fe volume fraction (p) of 0.42 deposited at a substrate temperature ($T_s$) of 575° K.

FIG. 2 (b) is a micrograph of an Fe-$SiO_2$ composite having an Fe volume fraction (p) of 0.42 which was deposited at a substrate temperature ($T_s$) of 875° K.

DESCRIPTION OF THE PREFERRED EMBODIMENTS

Figure 1:
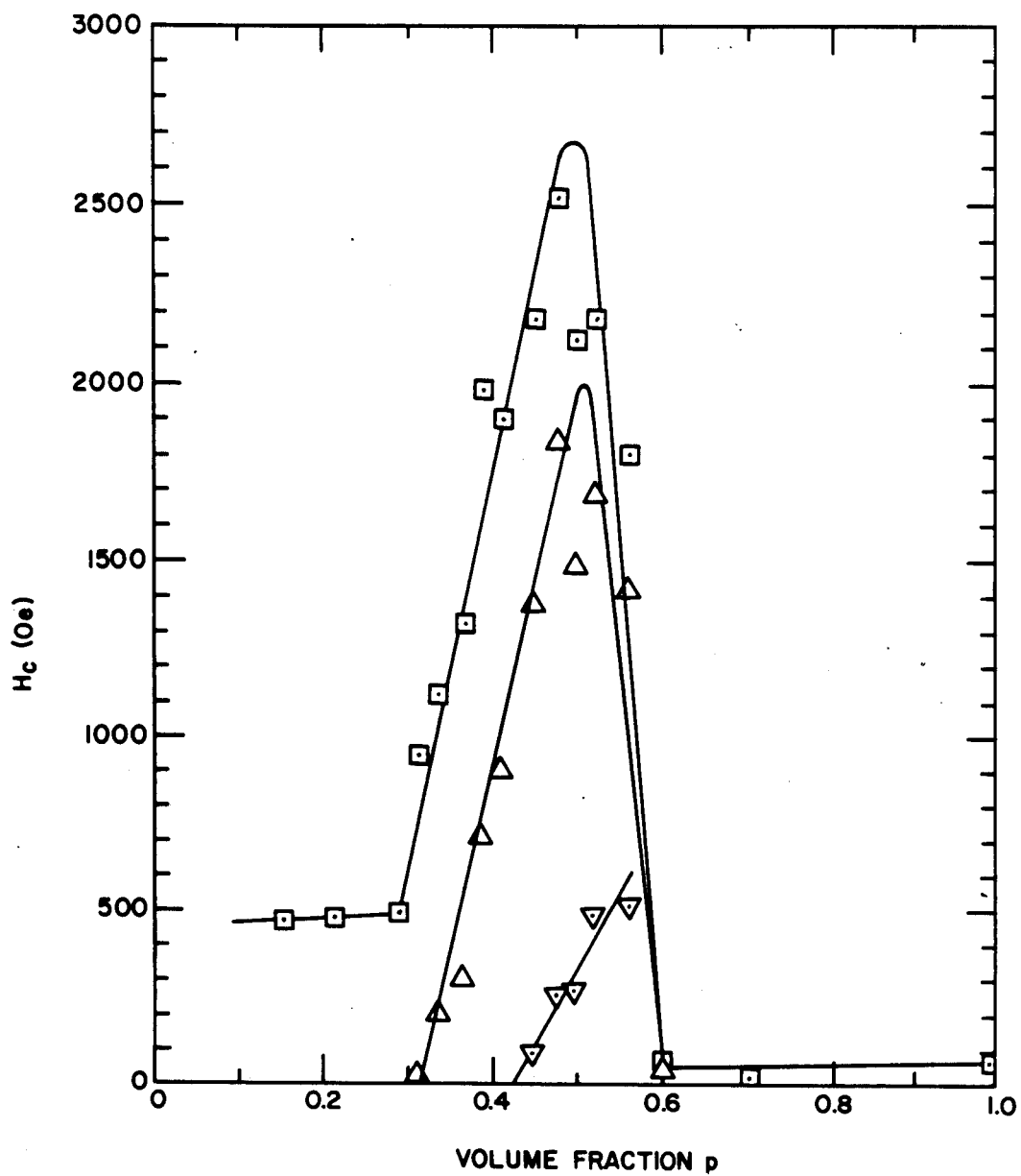
FIG. 1 is a plot of coercivity ($H_c$) at various temperatures versus Fe volume fraction (p) of various Fe-$SiO_2$ composites.

The cermets of this invention are thus characterized by properties that make them particularly attractive as high density recording media. More particularly, the invention is concerned with cermets made under carefully controlled process conditions whereby the microstructure, and hence the magnetic properties, of the cermets are controlled. In addition, the cermets of this invention are characterized by chemical stability, wear resistance and corrosion resistance.

The cermets of this invention broadly comprise composites of a ferromagnetic metal and an insulator. Preferred ferromagnetic metals are Fe, Co and Ni as well as alloys thereof. Examples of suitable insulators are MgO, BN, $Al_2O_3$ and $SiO_2$. Preferred are metal oxides selected from the group consisting of $Al_2O_3$ and $SiO_2$. $SiO_2$ is most preferred.

The cermets of the invention are prepared by the use of a sputtering apparatus whereby a composite target comprising a mixture, preferably homogeneous, of a ferromagnetic metal and an insulator is subjected to ionic bombardment. Alternatively, twin-gun sputtering may be employed whereby separate ferromagnetic metal and insulator targets are sputtered simultaneously toward the substrate. This may be achieved in a sputtering apparatus employing a diode and a rf source, a simple dc source or a magnetron. Such sputtering apparatuses are well known in the prior art. A dc source can be used for conducting targets whereas a rf source can accommodate both conducting and insulating targets. A magnetron is a diode with an applied magnetic field and may employ either a dc source or a rf source.

In twin-gun sputtering, both the ferromagnetic metal and the insulator targets ma be aimed at the substrate so as to cause uniform deposition of both the metal and the insulator thereon. Alternatively, the two targets may be merely pointed at the substrate which is rotated at high speed to thereby cause uniform deposition of both the ferromagnetic metal and the insulator. It should be noted that the faster the substrate is rotated, the smaller the particle size of the deposited metal.

Composite targets are prepared by mixing appropriate amounts of ferromagnetic metal and insulator, preferably to form a homogeneous mixture, and the mixture is subjected to a pressure in excess of 15 tons per square inch. The resultant target is then annealed at elevated temperature, e.g., about 600° C., in high purity argon gas. The target is then ready for use.

As mentioned above, the microstructure of the cermets of this invention is critical if the desired magnetic properties are to be obtained. Basically, the cermets have a metal volume fraction (p) within the range of from about 0.30 to about 0.55, which upper limit approaches the percolation threshold ($p_c$) of about 0.6. The preferred volume fraction for Fe is 0.42. The cermets also have a metal particle size within the broad range of from about 30 Å to about 200 Å. The preferred particle size will vary depending on the ferromagnetic metal. The range of particle sizes for Fe is about 30 Å to about 200 Å, with the maximum size for single-domain Fe particles being about 200 Å. The preferred particle size for Fe is about 150 Å. Similar particle sizes apply when the ferromagnetic metal in Co or Ni.

As stated above, a cermet having a metal volume fraction and metal particle size within the foregoing ranges would not be expected to inherently have the high levels of magnetization and coercivity exhibited by the cermets of this invention. The superior magnetic properties of the cermets of this invention are a function of, and the result of, the process by which they are prepared.

The cermets of this invention, which comprise a ferromagnetic metal and an insulator wherein the volume fraction of the metal is within the range of from about 0.30 to about 0.55 and the metal particle size is within the range of from about 30 Å to about 200 Å, obtain their superior properties by controlling the process parameters of sputtering gas pressure, deposition rate and substrate temperature ($T_s$) Of these, the most critical is substrate temperature ($T_s$).

The sputtering gas is an inert gas that comprises the atmosphere within the sputtering apparatus. The inert gas is typically one of the rare gases, preferably argon (Ar). As sputtering gas pressure increases, metal particle size decreases. Accordingly, sputtering gas pressure is kept low to favor large metal particle size. The preferred sputtering gas pressure is within the range of from about 2 to about 3 microns ($\mu$) of mercury.

The deposition rate is kept constant to ensure uniform size of the granules in the aggregate cermet. A deposition rate within the range of about 0.04 to about 0.06 $\mu$/min. is preferred, with a deposition rate of about 0.05 $\mu$/min. being most preferred.

The substrate temperature ($T_s$) has the most pronounced effect on the microstructure of the cermets of this invention. As substrate temperature increases, metal particle size increases. Above about 400° K., metal particle size increases by about 25 Å/100° K. The substrate temperature useful in the practice of this invention is within the range of from about 300° K. to about 900° K., with the preferred range being from about 700° K. to about 800° K. Most preferred is a substrate temperature of about 775° K.

It should be noted that there is a relationship between metal volume fraction and metal particle size. As would be expected, metal particle size increases as metal volume fraction increases.

By way of example, granular Fe-SiO$_2$ films where prepared by use of a high-rate rf magnetron sputtering device using homogeneous composite targets of Fe and SiO$_2$. The targets were prepared by homogeneously mixing appropriate amounts of Fe and SiO$_2$ and subjecting the resultant mixture to a pressure in excess of about 15 tons/in.$^2$. The resultant targets were then annealed at about 600° C. in a high purity Ar gas atmosphere. All samples of cermet, except those for transmission electron microscopy (TEM), were about 2 to 5 $\mu$ in thickness deposited onto various substrates such as glass, mica, Kapton, metals and alumina. Very good adhesion of the cermets to glass, Kapton and metal substrates was noted. Sputter depositions were made with the substrates at various temperatures from 77° K. to 875° K. in order to alter the morphology of the cermet films. The Ar sputtering gas pressure was in the range of about 2 to about 3 $\mu$ of mercury and the deposition rate of the aggregate cermet was about 0.05 $\mu$/min. The microstructure and composition of the samples were characterized by transmission electron microscopy (TEM), electron and x-ray diffractions, atomic absorption and $^{57}$FE Mössbauer spectroscopy. The magnetic properties were measured by means of a SQUID magnetometer with a field range of 0 to 50 kOe and a temperature range of 2° K. to 400° K.

A cermet with a composition of Fe$_{75}$ (SiO$_2$)$_{25}$ and an iron volume fraction (p) of 0.42 was chosen because, as shown in FIG. 1, a maximum in coercivity (H$_c$) was achieved at this iron volume fraction. FIG. 1 is a plot of coercivity (H$_c$) measured at various temperatures versus iron volume fraction (p) of various Fe-SiO$_2$ composites. A number of process conditions such as sputtering gas pressure, deposition rate and substrate temperature ($T_s$) were varied in order to prepare samples with different microstructures, particularly metal particle size.

The granular nature of the Fe-SiO$_2$ samples with Fe volume fraction (p) equal to 0.42 deposited onto substrates at substrate temperatures between 77° K. and 875° K. were revealed by transmission electron microscopy. Samples of cermets deposited at substrate temperatures between 77° K. and 400° K. had Fe particles of about 40 Å which did not vary significantly in size. As shown in FIG. 2 (a), the sample deposited at a substrate temperature of 575° K. had larger Fe particles of about 60 Å. The size of the Fe particles was greatly increased with higher substrate temperatures. As depicted in FIG. 2 (b), in cermet film samples deposited at a substrate temperature of 875° K., the Fe particle size is about 160 Å.

Also employed was $^{57}$Fe MöossMbauer spectroscopy to microscopically probe the Fe-containing portions of the cermet samples. The spectra exhibited essentially the same hyperfine field as that of $\alpha$-Fe, although the line widths were noticeably broader as expected considering the small particle size. There were no observable amounts of Fe oxides which would generally exhibit much larger hyperfine fields. These studies indicated that the particles were primarily pure Fe.

The saturation magnetization of a cermet, measured at 6° K., was 155 emu/g. of total sample, equivalent to a value of 210 emu/g. of Fe in the sample. This is within 5% of the value for pure Fe. The magnetic moment per Fe particle is therefore about 2 Bohr magnetons ($\beta$B). There was no evidence of either enhancement or diminution of the magnetic moment of Fe as a consequence of its being incorporated into a cermet.

Figure 3:
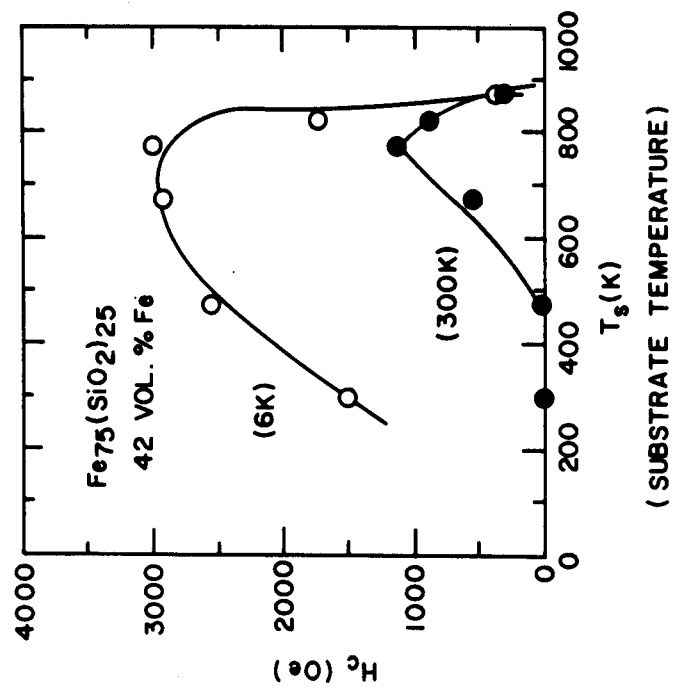
FIG. 3 is a plot of coercivity ($H_c$) versus substrate temperature ($T_s$) of an Fe-$SiO_2$ composite having an Fe volume fraction (p) of 0.42.

By increasing the granule size, such as by employing higher substrate temperature ($T_s$), the coercivity (H$_c$) is dramatically affected in both magnitude and temperature dependence. As shown in FIG. 3, H$_c$ at 6° K. increases from 1.5 kOe to about 3 kOe as $T_s$ is increased from 300° K. to 775° K. These values at 6° K. are essentially those of the ground state, i.e., a temperature of 0° K. The values of H$_c$ at 300° K. are considerably reduced as expected, but the reductions are not proportional to the values at 6° K. This is because the temperature dependence of H$_c$ is largely dictated by the granule size; the more pronounced temperature dependence occurring in the smaller granules. Consequently, for the smaller granules ($T_s$ below 475° K.), H$_c$ is essentially 0 at 300° K. On the other hand, for samples with $T_s$ greater than 800° K., H$_c$ at both 6° K. and 300° K. also decreases precipitously. There are two likely causes. The granule sizes for these samples are about 150 Å, approaching the estimated critical size of 200 Å for single-domain Fe particles. Some granules may become multi-domain, which drastically degrades H$_c$. A more likely cause, however, is the alteration of the granular structure at high temperatures. The transmission electron microscopy micrograph shown in FIG. 2 (b) indicates sintering between the Fe granules. The partially connected granules effectively allow the formation of regions of multi-domain, thus reducing H$_c$.

A maximum H$_c$ at both 6° K. and 300° K. is achieved when $T_s$ is about 775° K. The values of H$_c$ of 3 kOe at 6° K. and 1.1 kOe at 300° K. are among the highest for Fe particles. The high value at 300° K. is particularly encouraging for possible recording media applications.

Figure 4:
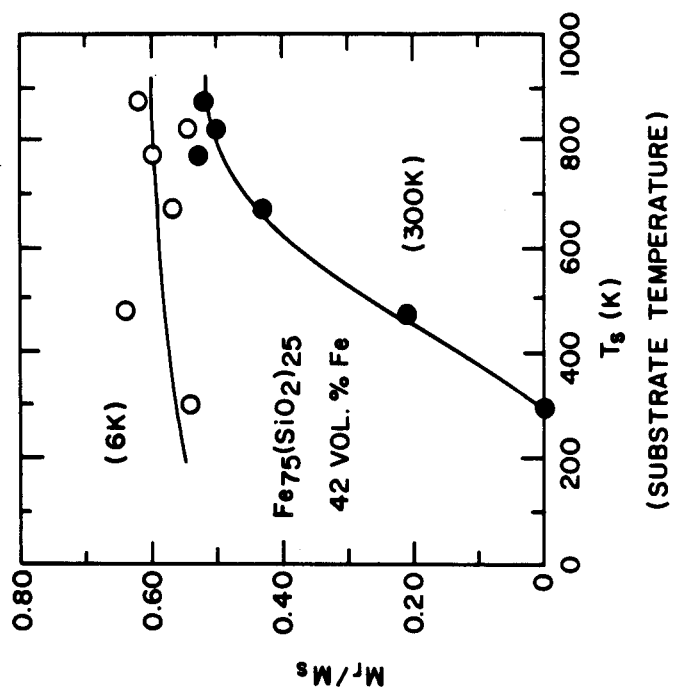
FIG. 4 is a plot of remanence ($M_r$) over saturation magnetization ($M_s$) versus substrate temperature ($T_s$) for an Fe-$SiO_2$ composite having an Fe volume fraction (p) of 0.42.

FIG. 4 shows the squareness, defined as the ratio of remanance (M$_r$) and saturation magnetization (M$_s$), for cermets prepared at various substrate temperatures. The squareness at 6° K. is about 0.6, essentially independent of substrate temperature ($T_s$). As expected, the squareness at 300° K. is reduced, but the reduction is much more for the smaller particles for the same reasons mentioned earlier, i.e., more pronounced temperature dependence occurs in the smaller granules. The squareness at 300° K. is also the highest for a substrate temperature ($T_s$) of about 775° K. or above.

When similar Fe-SiO$_2$ cermets are prepared using a homogeneous Fe-SiO$_2$ composite as the target and either a rf source or a dc source, the resultant cermet would have properties very similar to those of the foregoing Fe-SiO$_2$ cermets prepared by use of a magnetron. Similarly, when a different insulator such as Al$_2$O$_3$ is used in place of SiO$_2$ to prepare a cermet in accordance with the practice of this invention, the cermet would have superior magnetic properties similar to those described above for cermets where SiO$_2$ is the insulator.

Iron as the ferromagnetic metal may be replaced by Ni or Co, or various alloys of Fe, Co and Ni, to prepare cermets in accordance with the practice of this invention. Such cermets would have the superior magnetic properties characteristic of the cermets of this invention.

It is not critical to the practice of this invention to use a single target comprising a homogeneous mixture of the ferromagnetic metal and the insulator. Accordingly, a single target may be used which comprises a heterogeneous mixture of ferromagnetic metal and insulator. Alternatively, separate metal and insulator targets may be used with either stationery or rotating substrates.

Thus, in its broadest sense, the instant invention provides improved cermets having superior properties comprising a ferromagnetic metal and an insulator. By controlling process conditions, cermets having high magnetization and high coercivity as well as chemical stability, wear resistance and corrosion resistance are prepared. A particular advantage of the cermets of this invention is high coercivity at elevated temperatures, e.g., about 300° K. The critical process conditions are sputtering gas pressure, deposition rate and substrate temperature. The cermets of this invention find particular utility as high density recording media.

While specific embodiments of the present invention have been shown and described in detail to illustrate the utilization of the inventive principles, it is to be understood that such showing and description have been offered only by way of example and not by way of limitation. Protection by Letters Patent of this invention in all its aspects as the same are set forth in the appended claims is sought to the broadest extent that the prior art allows.

We claim as our invention:

1. A process for preparing ferromagnetic metalinsulator composites having a metal volume fraction within the range of from about 0.30 to about 0.55 and a metal particle size within the range of from about 30 Å to about 200 Å comprising the steps:
    a. Preparing a composite target comprising a mixture of a ferromagnetic metal and an insulator;
    b. Placing said composite target in a sputtering apparatus containing an inert sputtering gas and a substrate;
    c. Maintaining the substrate at a temperature within the range of from about 700° K. to about 800 ° K., and
    d. Subjecting said composite target to ionic bombardment to thereby sputter a homogeneous film of said ferromagnetic metal and said insulator onto the surface of said substrate.

2. The process of claim 1 wherein said ferromagnetic metal is selected from the group consisting of Fe, Co, Ni and alloys thereof, and said insulator is selected from the group consisting of SiO$_2$ and Al$_2$O$_3$.

3. The process of claim 2 wherein said composite target is a homogeneous mixture of said ferromagnetic metal and said insulator and said sputtering apparatus is a magnetron.

4. The process of claim 3 wherein said inert sputtering gas is argon at a pressure of about 2 to about 3 $\mu$ of mercury.

5. The process of claim 4 wherein said ferromagnetic metal is Fe and said insulator is SiO$_2$.

6. The process of claim 5 wherein the volume fraction of Fe is about 0.42 and the particle size of Fe is about 150 Å.

7. The process of claim 6 wherein said substrate is at a temperature of about 775° K.

8. The process of claim 7 wherein the deposition rate of the composite of Fe and SiO$_2$ onto said substrate is about 0.05 $\mu$/min.

9. The process of claim 4 wherein said ferromagnetic metal is Co having a particle size of about 150 Å.

10. The process of claim 4 wherein said ferromagnetic metal is Ni having a particle size of about 150 Å.

11. Ferromagnetic metal-insulator composites having a metal volume fraction within the range of from about 0.30 to about 0.55 and a metal particle size within the range of from about 30 Å to about 200 Å prepared by a process comprising the steps:
    a. Preparing a composite target comprising a mixture of a ferromagnetic metal and an insulator;
    b. Placing said composite target in a sputtering apparatus containing an inert sputtering gas and a substrate;
    c. Maintaining the substrate at a temperature within the range of from about 700° K. to about 800° K., and
    d. Subjecting said composite target to ionic bombardment to thereby sputter a homogeneous film of said ferromagnetic metal and said insulator onto the surface of said substrate.

12. The ferromagnetic metal-insulator composites of claim 11 wherein said ferromagnetic metal is selected from the group consisting of Fe, Co, Ni and alloys thereof, and said insulator is selected from the group consisting of SiO$_2$ and Al$_2$O$_3$.

13. The ferromagnetic metal-insulator composites of claim 12 wherein said composite target is a homogeneous mixture of said ferromagnetic metal and said insulator and said sputtering apparatus is a magnetron.

14. The ferromagnetic metal-insulator composites of claim 13 wherein said inert sputtering gas is argon at a pressure of about 2 to about 3 $\mu$ of mercury.

15. The ferromagnetic metal-insulator composites of claim 14 wherein said ferromagnetic metal is Fe and said insulator is SiO$_2$.

16. The ferromagnetic metal-insulator composites of claim 15 wherein the volume fraction of Fe is about 0.42 and the particle size of Fe is about 150 Å.

17. The ferromagnetic metal-insulator composites of claim 16 wherein said substrate is at a temperature of about 75° K.

18. The ferromagnetic metal-insulator composites of claim 17 wherein the deposition rate of the composite of Fe and SiO$_2$ unto said substrate is about 0.05 $\mu$/min.

19. The ferromagnetic metal-insulator composites of claim 14 wherein said ferromagnetic metal is Co having a particle size of about 150 Å.

20. The ferromagnetic metal-insulator composites of claim 14 wherein said ferromagnetic metal is Ni having a particle size of about 150 Å.

* * * * *

UNITED STATES PATENT AND TRADEMARK OFFICE
CERTIFICATE OF CORRECTION

PATENT NO.   : 4,973,525
DATED        : November 27, 1990
INVENTOR(S)  : Chia-Ling Chien, et al.

It is certified that error appears in the above-identified patent and that said Letters Patent is hereby corrected as shown below:

On the title page, before item (57) the Attorney, Agent or firm should read --Edwin T. Yates--.

Signed and Sealed this

Twenty-eighth Day of April, 1992

Attest:

HARRY F. MANBECK, JR.

*Attesting Officer*  *Commissioner of Patents and Trademarks*